United States Patent
Figaro et al.

(10) Patent No.: US 9,035,648 B2
(45) Date of Patent: May 19, 2015

(54) MAGNETIC SENSOR CHARACTERIZATION

(75) Inventors: Davy J. Figaro, Sebastopol, CA (US); Joseph F. Miller, Santa Rosa, CA (US); Andrew T. Taylor, Santa Rosa, CA (US); George Hsu, Boca Raton, FL (US)

(73) Assignee: PNI Sensor Corporation, Santa Rosa, CA (US)

(*) Notice: Subject to any disclaimer, the term of this patent is extended or adjusted under 35 U.S.C. 154(b) by 445 days.

(21) Appl. No.: 13/475,964

(22) Filed: May 19, 2012

(65) Prior Publication Data

US 2013/0009636 A1    Jan. 10, 2013

Related U.S. Application Data

(63) Continuation-in-part of application No. 13/175,991, filed on Jul. 5, 2011, now Pat. No. 8,749,231.

(51) Int. Cl.
   *G01R 33/02* (2006.01)
(52) U.S. Cl.
   CPC ........................... *G01R 33/02* (2013.01)
(58) Field of Classification Search
   CPC ....................................................... G01R 33/02
   USPC ................................... 324/244, 228, 260
   See application file for complete search history.

(56) References Cited

U.S. PATENT DOCUMENTS

| | | | |
|---|---|---|---|
| 4,851,775 | A | 7/1989 | Kim et al. |
| 5,239,264 | A | 8/1993 | Hawks |
| 2011/0187350 | A1 | 8/2011 | Ausserlechner et al. |
| 2011/0241662 | A1 | 10/2011 | Muraoka et al. |
| 2011/0248704 | A1 | 10/2011 | Chowdhary et al. |

*Primary Examiner* — Reena Aurora
(74) *Attorney, Agent, or Firm* — Brian R. Short

(57) ABSTRACT

Apparatuses, methods and systems of a magnetic sensor self-characterizing its magnetic properties are disclosed. One embodiment of the magnetic sensor apparatus includes a magnetic sensor and a current source for applying a current to the magnetic sensor. The magnetic sensor apparatus further includes control circuitry configured to control the current source, and characterize a magnetic property of the magnetic sensor based on the applied current. One method of a magnetic sensor self-characterizing its magnetic properties includes applying, by the magnetic sensor, an electrical signal, and characterizing a magnetic property of the magnetic sensor based on the applied electrical signal.

25 Claims, 10 Drawing Sheets

MAGNETIC SENSOR CHARACTERIZATION

RELATED APPLICATIONS

This patent application is a continuation-in-part (CIP) of U.S. patent application Ser. No. 13/175,991, filed Jul. 5, 2011, which in herein incorporated by reference.

FIELD OF THE EMBODIMENTS

The described embodiments relate generally to magnetic sensors. More particularly, the described embodiments relate to apparatuses, methods and systems for characterizing magnetic sensors.

BACKGROUND

Magnetic Sensors may be employed in many areas of technology, for determining, for example, intensity, angle, rotational speed, and/or direction of a magnetic field or other magnetic-field-related quantities.

In many fields of application and concrete implementations of magnetic sensors, it is desired to be able to perform as accurate a measurement possible, while at the same time maintaining sufficient reliability in operation and/or reliability in fabrication.

It is desirable to have apparatuses, methods, and systems for magnetic sensor testing and characterization that is on-chip and can be performed during the process of manufacturing magnetic sensors.

SUMMARY

An embodiment includes a magnetic sensor apparatus. The magnetic sensor apparatus includes a magnetic sensor, and a current source for applying a current to the magnetic sensor. The magnetic sensor apparatus further includes control circuitry configured to control the current source, and characterize a magnetic property of the magnetic sensor based on the applied current.

Another embodiment includes a method of a magnetic sensor self-characterizing magnetic properties. The method includes applying, by the magnetic sensor, an electrical signal, and characterizing a magnetic property of the magnetic sensor based on the applied electrical signal.

Another embodiment includes a testing system for a magnetic sensor. The testing system includes a controlled electrical signal source, and a controller operative to characterize a magnetic property of the magnetic sensor by controlling the application of an electrical signal by the controlled electrical signal source across the magnetic sensor, and monitoring the magnetic property of interest which is inherent within the response of the magnetic sensor to the said electrical signal applied, Another embodiment includes a magnetometer. The magnetometer includes a coil wound around a high-permeability isotropic core, and a Schmitt trigger oscillator. The Schmitt trigger oscillator includes first and second terminals, wherein the coil is connected between the first and second terminals, and wherein an externally applied magnetic field influences a frequency of oscillations of the Schmitt trigger oscillator. The magnetometer further includes a current source configured to controllably apply a current through the coil, thereby allowing magnetic properties of the magnetometer to be characterized independent of the externally applied magnetic field.

Other aspects and advantages of the described embodiments will become apparent from the following detailed description, taken in conjunction with the accompanying drawings, illustrating by way of example the principles of the described embodiments.

DETAILED DESCRIPTION

The described embodiments provide for characterizing magnetic sensors. One embodiment includes a magnetic sensor that is capable of self-characterizing itself. Other embodiments include methods and systems for characterizing magnetic sensors and magnetic sensor elements, such as a magneto-inductive coil.

Testing of magnetic sensors can be performed after the magnetic sensors have been manufactured, but without the need for typical magnetic testing instrumentation or infrastructure. Such typical testing includes, for example, a Helmholtz coil with closed loop feedback control, which both cancels ambient fields and generates a known magnetic field that is applied to a sensor device under test. The responses of the magnetic sensors can be observed while applying such known magnetic fields. The disclosed embodiments and approach is desirable because they do not require specialized Helmholtz coil testing equipment or infrastructure so that the testing can be implemented and applied in a high volume manufacturing environment, especially one in which the sensors are subjected to large local magnetic field transients as is typically the case.

Figure 1:
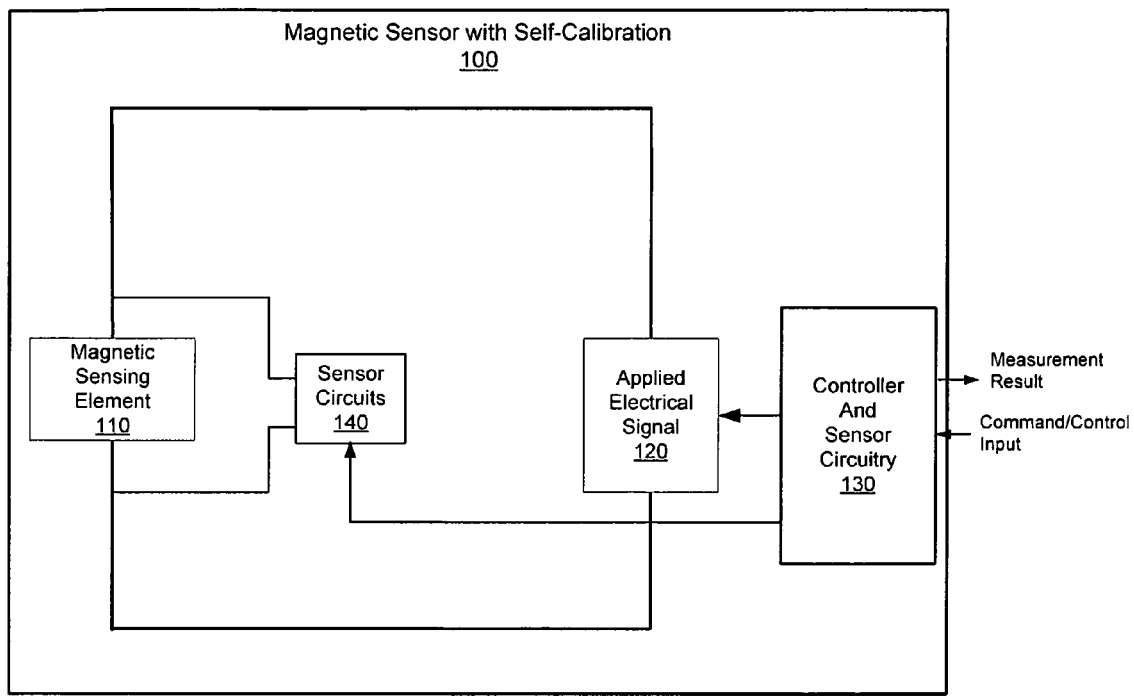
FIG. 1 shows an example of a magnetic sensor that includes self-characterization, according to an embodiment.

FIG. 1 shows an example of a magnetic sensor apparatus 100 that includes self-characterization. More specifically, a controller (and associated sensor circuitry) 130 controls the application of an electrical signal (120) to a magnetic sensing element 110 of the magnetic sensor 100. Sensor circuits 140 in conjunction with the controller 130 characterize the magnetic sensing element 110 based on the applied electrical signal. For at least some embodiments, the magnetic sensor 100 provides measurement results of the magnetic sensor, and can receive commands/control inputs.

For at least one embodiment, the magnetic sensor apparatus includes a magnetic sensor (magnetic sensing element), a current source for applying a current to the magnetic sensor, and control circuitry configured to control the current source, and characterize a magnetic property of the magnetic sensor based on the applied current.

For at least some embodiments, the characterization of the magnetic sensor is self-contained within the magnetic sensor. Therefore, the magnetic sensor can maintain the characterization after being shipped from a manufacturer.

Including the calibration on the same integrated circuit as the magnetic sensor's typical drive circuitry provides several substantial benefits. For example, such a configuration/embodiment does not require a factory calibration of the magnetic sensor for gain or linearity. That is, sensor linearization can be implemented to be automatic. Characteristics of the magnetic sensor that change can be compensated in the field—that is, away from the place of manufacture. Additionally, calibration of the magnetic sensor for temperature changes can be automatic.

Figure 2:
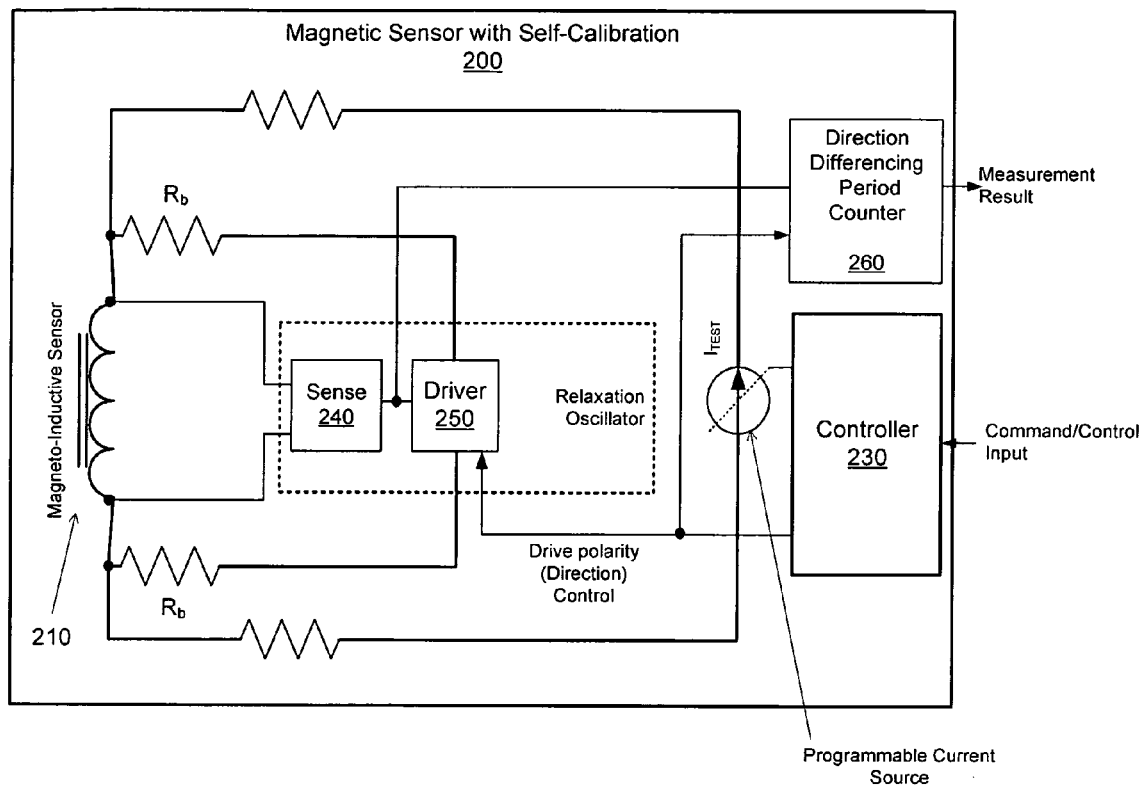
FIG. 2 shows additional detail of an example of a magnetic sensor that includes self-characterization circuitry, according to an embodiment.

FIG. 2 shows additional detail of an example of a magnetic sensor 200 that includes self characterization circuitry, according to an embodiment. For this embodiment, the magnetic sensing element includes a magneto-inductive sensor 210, and the applied electrical signal includes an applied current $I_{Test}$. A controller 230 controls the application of the applied current $I_{TEST}$ to the magneto-inductive sensor 210. While the current $I_{TEST}$ is being applied, the magneto-inductive sensor 210 is characterized by a combination of a sensor 240, a driver 250 and a counter 260.

For at least some embodiments, the magneto-inductive sensor 210 has a value of inductance that varies depending upon an intensity and direction of a magnetic field applied to the magnetic sensor 200. The application of a known magnetic field can be approximated with the application of the applied current $I_{TEST}$.

The inductance of the magneto-inductive sensor 210 varies with the application of a magnetic field or the application of applied current $I_{TEST}$. Accordingly, embodiments of the characterization of the magnetic sensor 200 include characterizations of the variation of the value of inductance, or the differential inductance, of the magneto-inductive sensor 210.

For at least some embodiments, the value of the differential inductance of the magneto-inductive sensor 210 is estimated by including the magneto-inductive sensor 210 within an oscillator. The frequency of the oscillation of the oscillator varies with the value of the inductance of the magneto-inductive sensor 210. Accordingly, monitoring the frequency of the oscillator can provide an estimate of a value of the differential inductance of the magneto-inductive sensor 210.

As shown, a specific embodiment includes a relaxation oscillator wherein the driver 250 provides incremental/directional changes in the current conducted by the magneto-inductive sensor 210. The sensor 240 and associated circuitry provides continuous monitoring of the frequency of the oscillator. As will be described, an embodiment includes an up/down counter that counts up with the application by the driver 250 of a first direction current, and counts down with the application by the driver 250 of an opposite direction current. Based on a value of a direction difference period counter 260, the differential inductance can be characterized (while controlling the application of the applied current $I_{TEST}$). An embodiment includes adjusting the applied current $I_{TEST}$ of the magneto-inductive sensor 210 until the difference count equals zero. By knowing the value of the applied current $I_{TEST}$ relative to the zero count $I_{TEST}$, the differential inductance of the magneto-inductive sensor 210 can be calculated. If the difference count equals zero the inductance is the same as if there is zero applied magnetic field. This zero count value provides the external field He and a reference point to characterize linearity.

Figure 7:
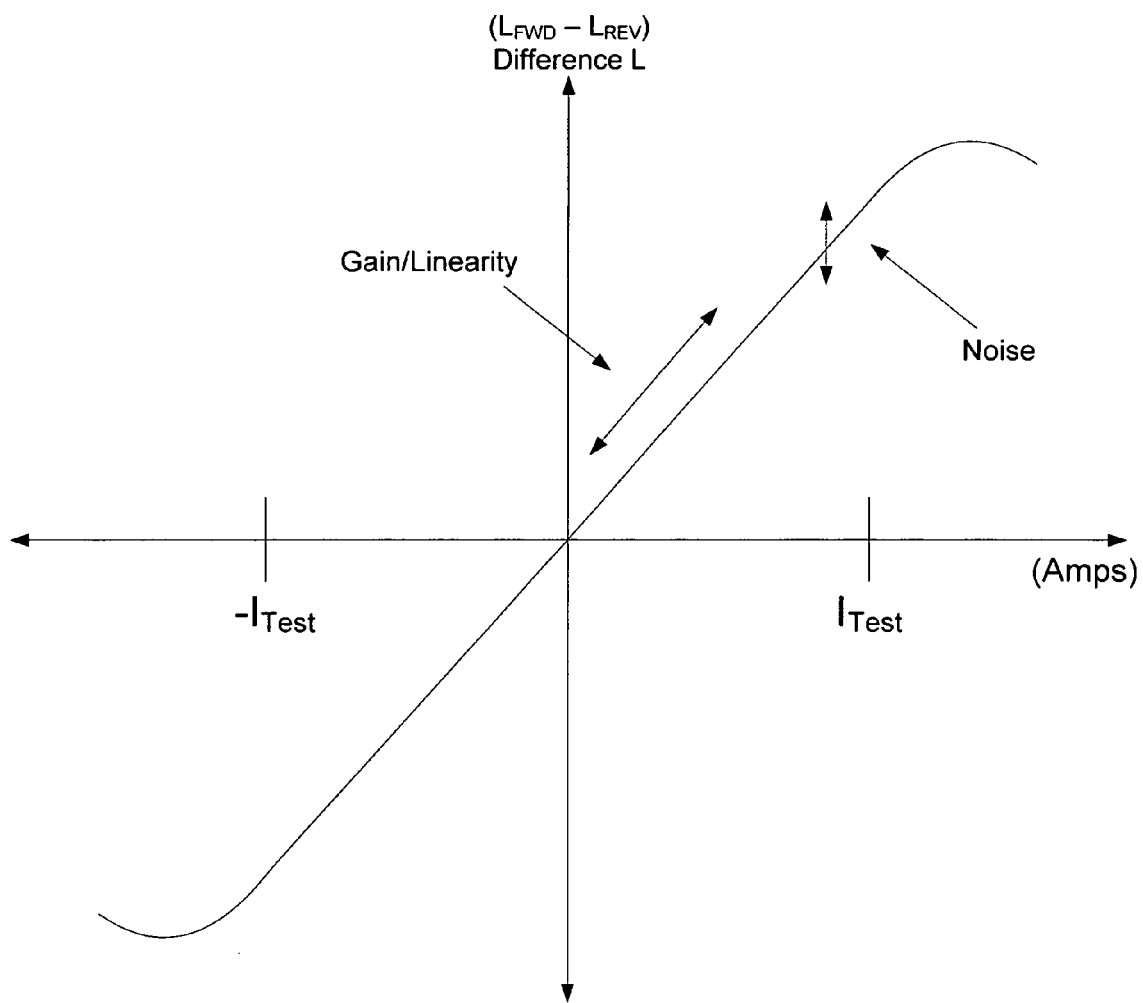
FIG. 7 shows an example of a plot of coil inductance (difference inductance) of a magnetic sensor with respect to an applied current.

The differential inductance curve (such as shown in FIG. 7) of the inductive sensor 210 can be used to characterize the magnetic sensor. For example, the magnetic sensor characterization can include the calculation of a gain that represents a change in a value of the inductance of the coil for different values of applied current $I_{TEST}$. Additionally or alternatively, the magnetic sensor characterization includes the calculation of a linearity of the gain of the coil for different values of applied current $I_{TEST}$. Additionally or alternatively, the magnetic sensor characterization includes the calculation of a noise of at least one value of magnetic property of the coil for multiple measurements of the value of the differential inductance for a single value of applied current. The calculation of a noise allows for characterization of sensor noise at different field levels (and consequently different inductance levels).

Additionally, for an embodiment, sensing the external magnetic field can be done by measuring the amount of $I_{TEST}$ required to drive and maintain the count value at zero. The advantage of such an implementation is that the linearity of the current source (that is, $I_{TEST}$) now becomes the salient factor in the magnetic measurement as opposed to the linearity of the sensor inductor coil. Furthermore, sensor noise is often a function of the magnitude of applied magnetic field, which changes the inductive operating region of the sensor. By always operating the sensor at its magnetic zero point (or any other fixed arbitrary inductive operating point), the noise characteristic of the sensor no longer changes as a function of the magnitude of the applied magnetic field which can be highly advantageous. Another advantage to such a mode of operation is the fact that for large ambient field values with a fixed offset component, a fixed value of $I_{TEST}$ can be applied to first cancel out the offset component (such as might be encountered in a system that contains a large hard iron magnetic distortion) before more precise and higher resolution measurements are taken of the field of interest (such as the Earth's magnetic field for geomagnetic based navigation, for instance). An embodiment includes a control loop that adjusts current through the coil to zero the count of the up/down counter, thereby continually forcing the count to zero, thereby cancelling out an ambient magnetic field that is not of interest to be measured.

After characterization and during normal operation, an intensity and direction of an applied magnetic field can be measured, and the measured result provided by the period counter 260. The characterization can occur at anytime. For at least some embodiments, the characterization can be triggered once per unit of time, and/or upon detection of a change of an environmental condition greater than a threshold. For example, characterization can be triggered upon sensing a temperature change of greater than a threshold, or mechanical vibration of greater than a threshold.

The controller 230 receives commands, and controls the driver 250 and the period counter 260.

Introduction to art Embodiment of a Magnetic Sensing Element

Figure 3A:
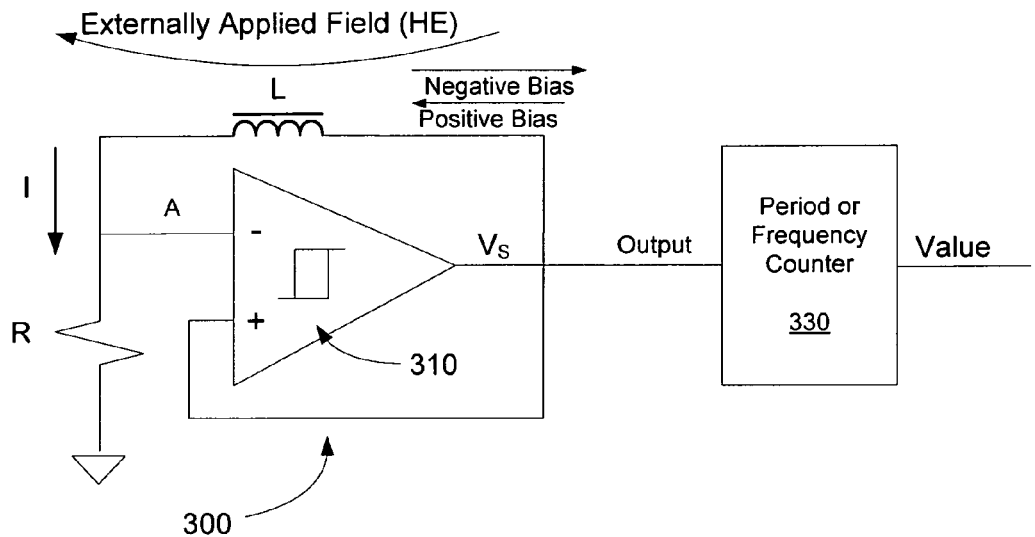
FIG. 3A shows an example of a magnetic field sensor that includes an oscillator, wherein a period of a signal generated by the oscillator is dependent upon an intensity of a sensed magnetic field.

FIG. 3A shows an example of a magnetic field sensor (magnetometer) that includes an oscillator 300, wherein a period of a signal generated by the oscillator 300 is dependent upon an intensity of a sensed external magnetic field. A frequency or period counter 330 receives an output signal of the oscillator. A value of an inductance L of the oscillator is dependent upon the intensity of the externally applied magnetic field. Therefore, the value at the output of the counter 330 is dependent upon the intensity of the externally applied magnetic field. As described, during characterization, the applied external magnetic field can be simulated by passing a test current through the coil of the oscillator, where the current flows through the coil but is isolated from the rest of the oscillator circuit.

As shown, $H_E$ represents the external magnetic field parallel to the coil. The total magnetic field the sensor experiences, H, is a function of the external magnetic field and the magnetic field established by the current running through the circuit, I. This can be expressed as:

$$H = k_0 I + H_E$$

where $k_0$ is a constant that depends on certain physical parameters of the sensor.

Figure 3B:
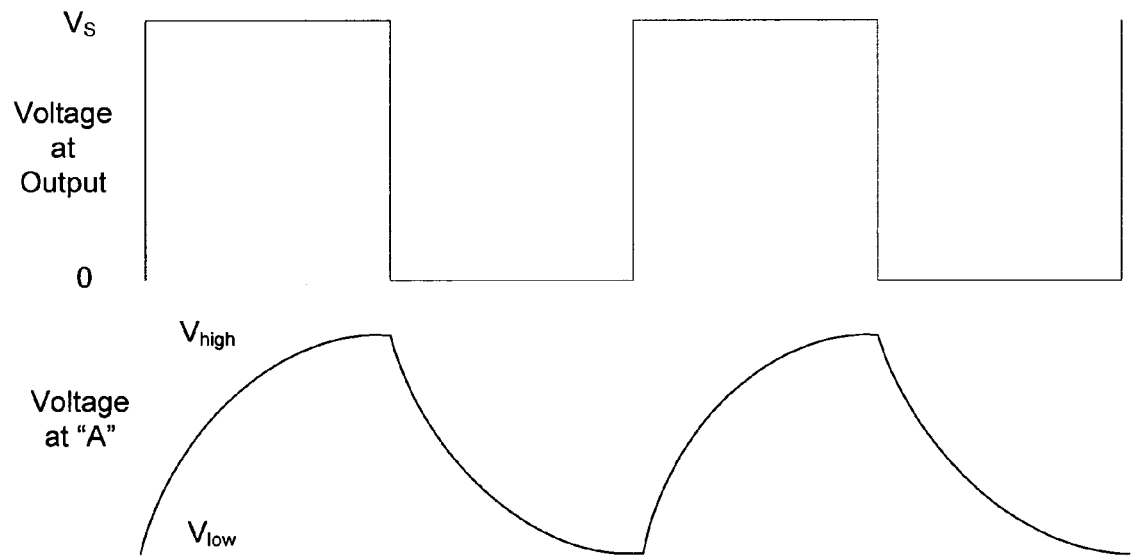
FIG. 3B shows an example of waveforms of the magnetic field sensor of FIG. 3A.

For the circuit of FIG. 3A, assuming a logical "0" value (0V or some value less than the trigger value) on an input to a Schmitt trigger 310, the Schmitt trigger yields an output value that is a logical "1" at some voltage $V_S$. This gradually drives up an input voltage across the sensor 300 until the voltage at (A) reaches a trigger threshold for the Schmitt Trigger, $V_H$. At this point, the Schmitt Trigger 310 detects the voltage at A as a logical "1", and the output of the Schmitt Trigger 310 becomes a logical "0". This drives the voltage down across the sensor 300, setting up an oscillation as depicted below in FIG. 3B. Note that the current, I, essentially mimics the voltage waveform at A.

For embodiments, the magnetic field sensor 300 incorporates a solenoidal-geometry coil (L) wrapped around a high-permeability magnetic core. The sensor's permeability, varies with the applied magnetic field, and consequently, the sensor's inductance, L, is also a function of the magnetic field, H.

Figure 4:
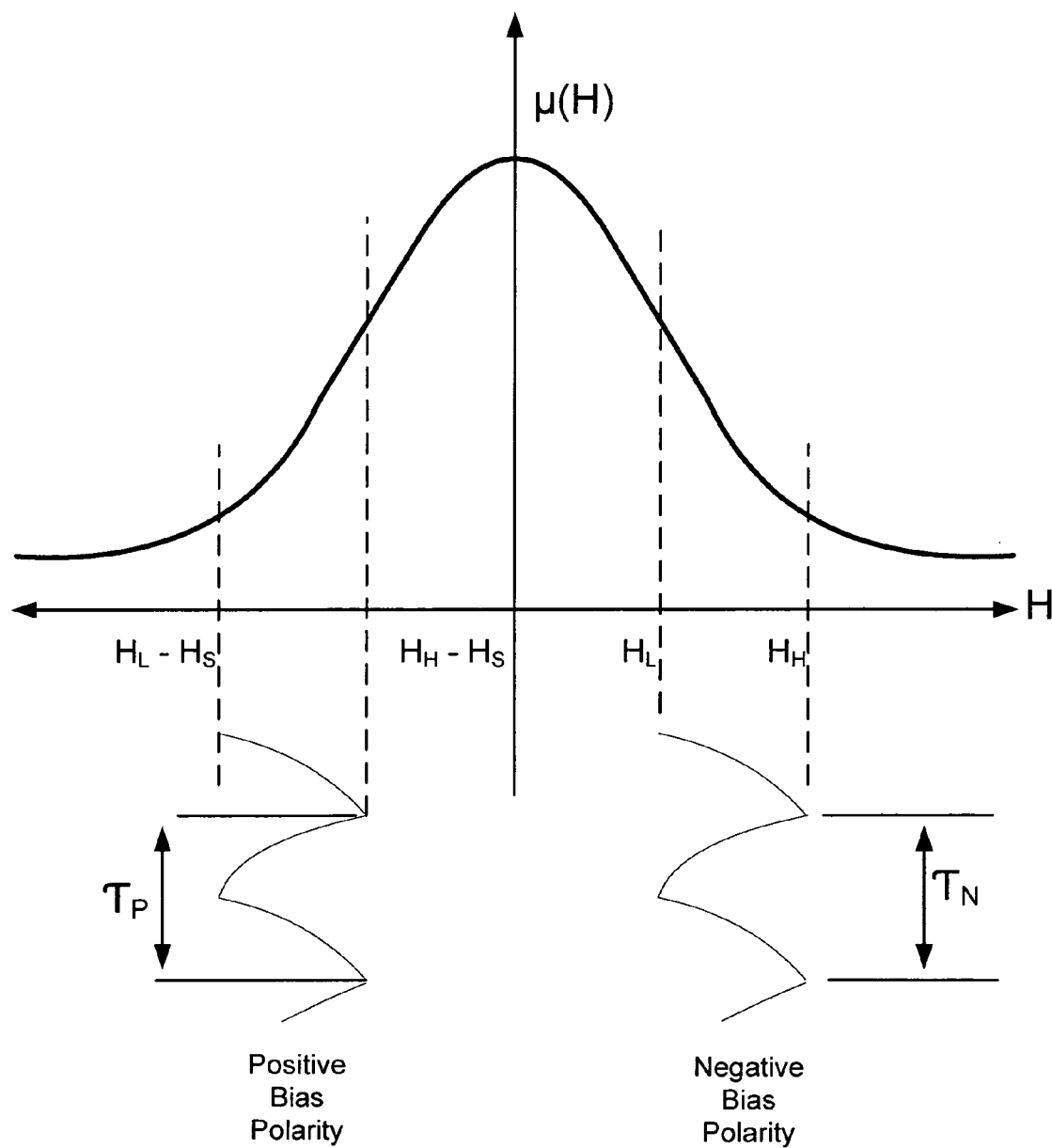
FIG. 4 shows examples of waveforms of a field sensor which is not exposed to an applied external field.

For the circuit depicted in FIG. 3A, the bias resistance, R, and drive voltage on the Schmitt Trigger 310 output ($V_S$) are selected such that the sensor's magnetic field is in the non-linear regime of the permeability curve. FIG. 4 depicts the voltage output when the circuit is driven with either a positive or negative bias (as depicted in FIG. 3A), but with no applied external magnetic field. Note that the period of oscillation is the same whether the circuit is positively or negatively biased.

Figure 5:
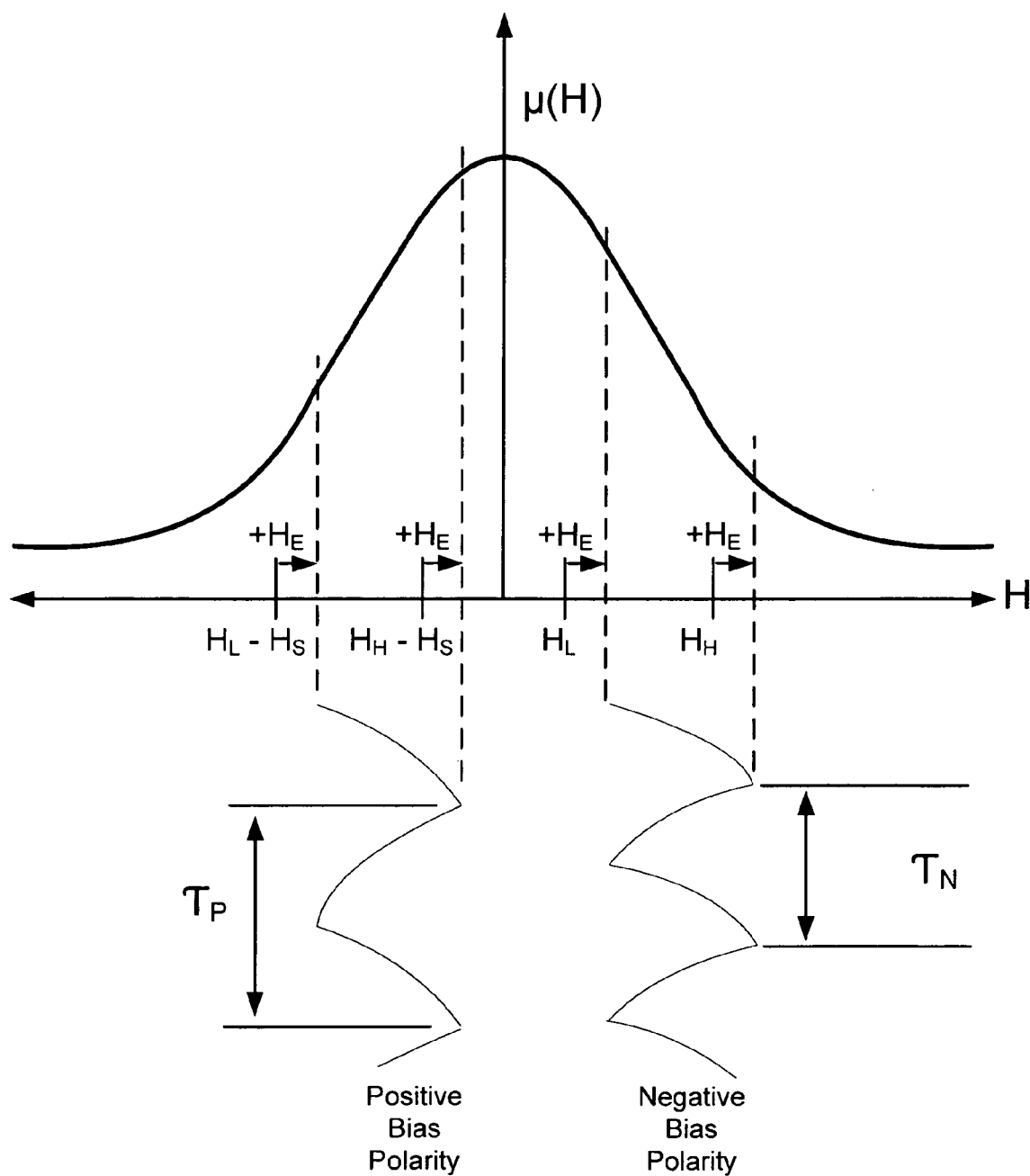
FIG. 5 shows examples of waveforms of a field sensor which is exposed to an applied external field.

When an external magnetic field is applied, $H_E$ (such as Earth's magnetic field), this causes both the positively and negatively biased curves to shift in the same direction. As depicted in FIG. 5, this shift causes the inductance to increase when the circuit is positively biased and to decrease when negatively biased. This, in turn, causes the period between cycles, τ, to increase for the positively biased circuit and decrease for the negatively biased circuit.

By measuring the time to complete a fixed number of oscillations (periods) that occur in the forward and reverse polarity directions and taking the difference between these two values, it is possible to derive the intensity and direction of the external magnetic field that is independent of offset drift as might happen when the ambient temperature of operation of the sensor changes from reading to reading.

The magneto-inductive sensing of the sensor of FIG. 3A provides some particularly useful attributes that set it apart from other magnetic sensing technologies. More specifically the output value can be represented digitally. Most other technologies provide an analog voltage output which is then used to derive the strength of the applied magnetic field by observing a change in voltage. In this case, noise either inherent in the circuit or from the surroundings can affect the attainable accuracy.

Figure 6:
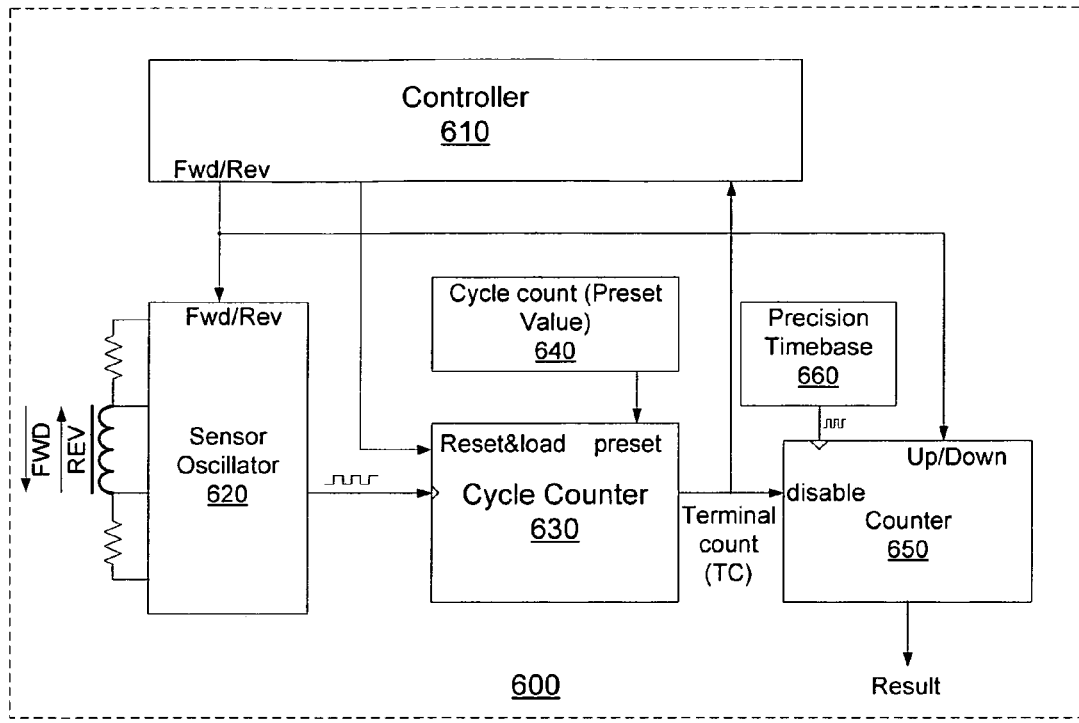
FIG. 6 shows an example of a magnetic field sensor that includes a pair of counters for providing a value representing an intensity and direction of a sensed magnetic field, according to an embodiment.
Figure 6:
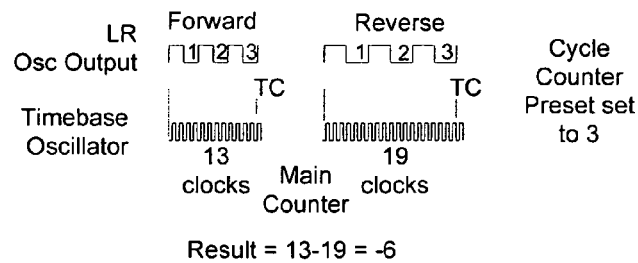

FIG. 6 shows an example of a magnetic field sensor 600 that includes a pair of counters 630, 650 for providing a value representing an intensity and direction of a sensed magnetic field. The sensor 600 includes a sensor oscillator 620 that can be similar in structure to the sensor of FIG. 3A.

The sensor oscillator 620 includes forward and reverse bias settings as controlled by a controller 610. Basically, the controller 610 sets a bias current through an inductor (for example, a solenoidal-geometry coil) in a forward direction (FWD) and in a reverse direction (REV). By determining the period and/or frequency variation of the output of the sensor oscillator for both the FWD and REV directions, the intensity and direction of the sensed magnetic field can be determined.

A cycle counter 630 counts cycles of the output of the sensor oscillator up to a preset value as determined by a count cycle 640. After the cycle counter 630 has counted to the preset value, the cycle counter 630 generates a terminal count (TC).

A counter 650 times the period required for the cycle counter 630 to generate a TC by counting a clock signal of a precision time-base 660. That is, the counter 650 is enabled and set to count (the clock signal) when the controller 610 sets the sensor oscillator in, for example, the FWD direction. The counter 650 is set to count up for one direction of the bias current, and set to count down for the other direction of the bias current. The result of the counter is dependent on the intensity of the applied magnetic field and the direction of the applied magnetic field. As shown in FIG. 6, an example of a preset value of the count cycle is 3. The counter 650 counts the high-speed clock cycle over the duration of time it takes for the cycle counter 630 to count 3 cycles of the output signal of the sensor oscillator 620. The example of FIG. 6 shows the counter 650 counting to 13 for the FWD bias, and counting down 19 for the REV bias, yielding a counter result of −6, This output (−6) provides an accurate representation of the intensity and direction of the sensed magnetic field.

The sensitivity of the magnetic sensor and sampler combination 600 can be increased by increasing the value of the count cycle. That is, as the time period of the counting is increased, the sensitivity and signal to noise ratio (SNR) increases. However, at some point, the SNR of the sampled signal can no longer be improved due to the presence of 1/f noise of the sensor oscillator.

As previously described, the application of a known magnetic field can be approximated with the application of the applied current $I_{TEST}$. Because the dimensions, geometry and number of turns of the coil are known from the coil design (or can be determined through physical measurement) and very stable and precise current sources can be implemented through electrical circuit design, a sensor's magnetic characteristics can be very precisely measured (in terms of magnetic field units) by the application of a known current flow through coil. Its precise magnetic response can be easily calculated using electromagnetic equations, such as Maxwell or Faraday equations, once these parameters are known and controlled. Also, as previously described, an embodiment includes adjusting the applied current $I_{TEST}$ of the magneto-inductive sensor 210 until the difference count equals zero, which serves to cancel out the external field $H_E$, giving the current $I_{TEST}$ corresponding to zero magnetic field at the sensor. Subsequently, as different values of $I_{TEST}$ are sent through the circuit, the differential inductance from zero field inductance can be calculated.

FIG. 7 shows an example of a plot of coil inductance of a magnetic sensor with respect to an applied current. More specifically, the plot depicts a plot of a difference inductance ($L_{FWD}-L_{REV}$) for a range of applied current $I_{TEST}$, which can be determined by the previously described cycle count of, for example, counter 650. The generation of such a plot (or at least portion of) for a magnetic sensor can be used to determine the gain, linearity and/or noise associated with the magnetic sensor.

As shown in FIG. 7, the gain of the magnetic sensor can be determined from 2 points on the plot. The linearity can be determined from 3 or more points from the plot. The noise can be determined by multiple measurements (counts) with the same value of applied current $I_{TEST}$.

Figure 8:
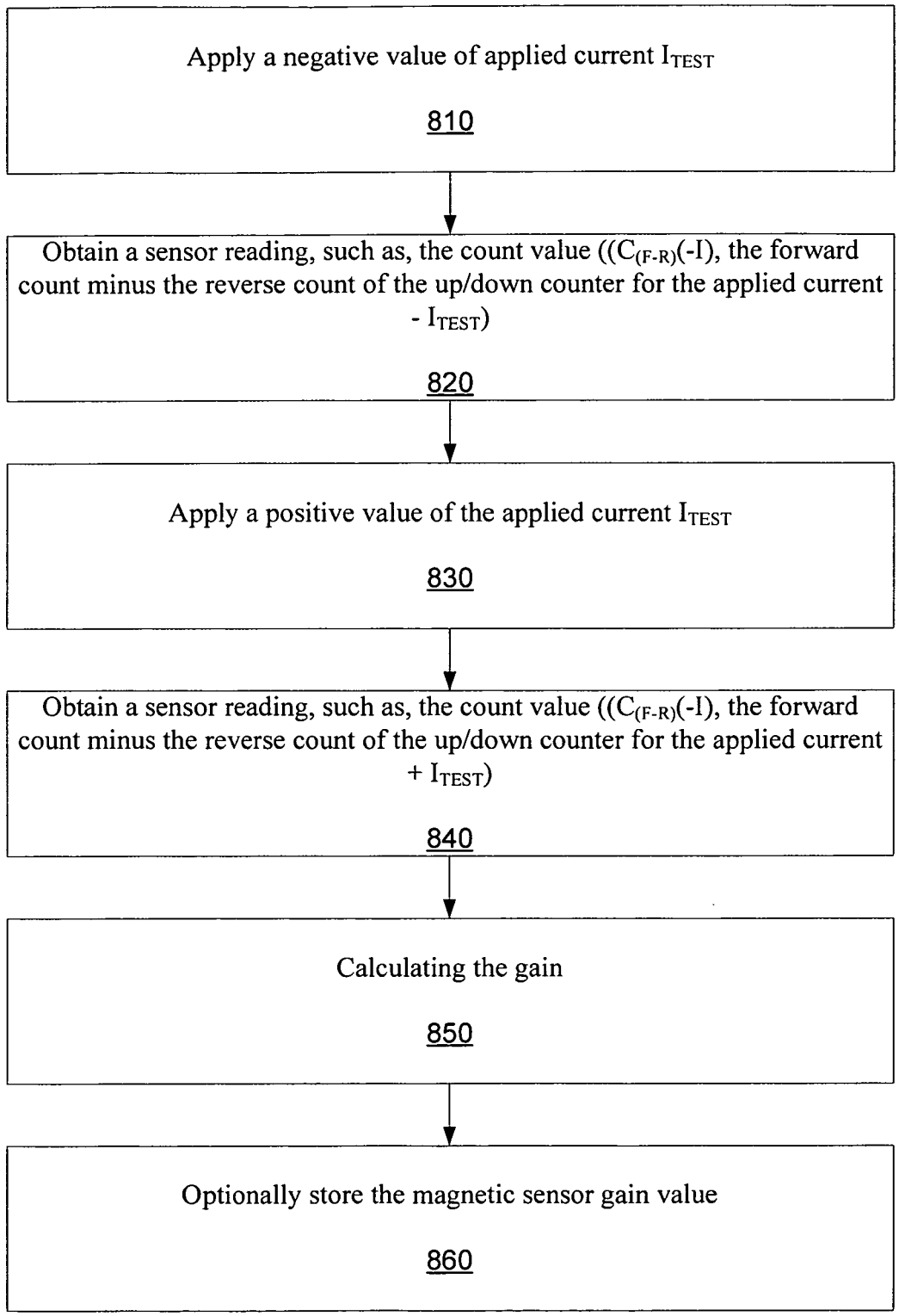
FIG. 8 is a flow chart that includes steps of a method of determining a gain of magnetic sensor, according to an embodiment.

FIG. 8 is a flow chart that includes steps of a method of determining a gain of magnetic sensor, according to an embodiment. A first step 810 includes applying a negative value of applied current $I_{TEST}$. A second step 820 includes obtaining a sensor reading, such as, the previously describe count value (($C_{(F-R)}(-I)$), that is, the forward count minus the reverse count of the up/down counter for the applied current $-I_{TEST}$. A third step 830 includes applying a positive value of the applied current $I_{TEST}$. A fourth step 840 includes obtaining a sensor reading, such as, the previously describe count value (($C_{(F-R)}(-I)$), that is, the forward count minus the reverse count of the up/down counter for the applied current $I_{TEST}$). A fifth step 850 includes calculating the gain based on the applied currents and the sensor readings (such as, the count values), Finally, a sixth step 860 includes optionally storing the magnetic sensor gain value.

Figure 9:
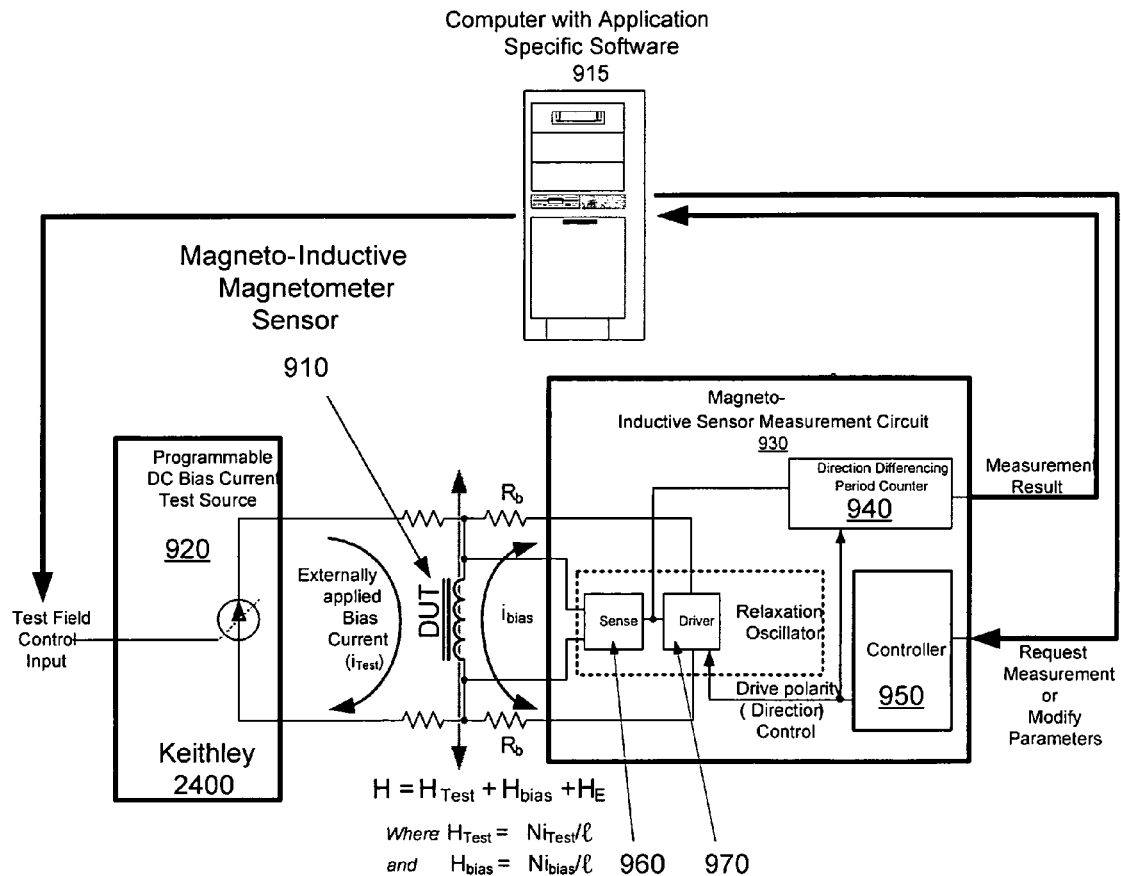
FIG. 9 shows an example of a test system and method that can be used to characterized magnetic sensor, according to an embodiment.

FIG. 9 shows an example of a test system and method that can be used to characterize a magnetic sensor according to an embodiment. As shown, the test system includes a computer 915 that, for embodiments, includes specific software for allowing the computer 915 to control both the application of a magnetic field (through, for example, the application of an externally applied current $I_{TEST}$) to a magneto-inductive sensor 910, and controls the measurement of the differential inductance of the magneto-inductive sensor 910. The applied magnetic field can be controlled by a programmable DC Bias Current Test Source 920. An exemplary Current Test Source is provided by a Keithley 2400® current source. The measurement of the differential inductance of the magneto-inductive sensor 910 can be performed by a magneto-inductive sensor measurement circuit 930 that includes a controller 950, a driver 970, a sensor 960 and a directional difference period counter 940. Embodiments of the combination of the controller 950, the driver 970, the sensor 960 and the directional difference period counter 940 are similar to the embodiments of FIG. 2 and FIG. 6.

As shown, $H_E$ represents the external ambient magnetic field parallel to the coil 910, and represents the offset field of the sensor. The total magnetic field flux density the sensor experiences, B, is a function of the external field ($B_E$) the bias field ($B_{bias}$) and Test Held ($B_{TEST}$) created by current miming through the wound coil of the coil (inductor) 910, This can be expressed as:

$$B=B_{TEST}+B_{bias}+B_E$$

Using Ampere's law relating the DC magnetizing force to the inductor current:

$$B=(\mu N/l)\cdot I_{TEST}+(\mu N/l)\cdot I_{bias}+B_E$$

$$H=H_{TEST}+H_{bias}+H_E=(N/l)\cdot I_{TEST}+(N/l)\cdot I_{bias}+H_E,$$

where:
$B=\mu H$; relation of magnetic field to flux density,
B Magnetic Field Flux Density (Tesla),
H Magnetic Field (Amps/meter),
$\mu$ Permeability constant (Newtons/Amps$^{-2}$).

$H_{bias}$ and $H_{TEST}$ are magnetic fields generated by the coil (inductor) 910 in Amps/m, $\mu$ is the permeability, $I_{TEST}$ and $I_{bias}$ are the currents in Amps, N is the number of turns of coil (wire) 910, and l is the mean magnetic path length, A relationship can be demonstrated between the coil inductance and the applied current $I_{TEST}$. This relationship expresses how inductance, and consequently oscillation frequency and counts, changes with a change in $I_{TEST}$. This change is directly related to the similar change in counts which occurs for a change in external field.

As described, a magnetic field measurement with the sensor includes both a $+H_{bias}$ and a $-H_{bias}$. In the resulting difference measurement $+H_{bias}$ and $-H_{bias}$ is canceled, leaving only the $H_{TEST}$ and $H_E$ components of the measurement.

As an initial condition, B is set to 0 by adjusting $I_{TEST}$ to a value $I_{TEST0}$ such that $B_{TEST}$ cancels out $B_E$. This sets up a zero field starting point, and subsequently allows defining $I_{TEST}$ relative to $I_{TEST0}$. As $I_{TEST}$ changes from the reference point where the total field at the sensor is zero, $B_{TEST}$ becomes the corresponding changing field experienced by the sensor.

$$B=B_{TEST}=(\beta N/l)\cdot I_{TEST},$$

$$H=H_{TEST}=(N/l)\cdot I_{TEST},$$

For a coil, inductance is approximately:

$$L=(AN^2/l)\beta,$$

where A=the cross section area of the coil. The permeability $\mu$ varies with field strength H and therefore also from applied current $I_{TEST}$ from an initial zero field value $\mu_r$. This can be defined as:

$$\beta=\beta_r+m_h H_{TEST},$$

where $m_h$=slope of $\beta$/H. $H_{TEST}$, which is generated by the current in the coil $I_{TEST}$, follows $I_{TEST}$ in a linear fashion, as in:

$$H_{TEST}=(N/l)\cdot I_{TEST},$$

$$\beta=\beta_r+m_h(N/l)\cdot I_{TEST}.$$

The change in H from $H_{TEST}$ will cause a change in $\beta$ according to the shape of the $\beta$-H curve, which is approximately linear in the region of interest, defined by the slope parameter $m_h$ (which may have a field dependent linearity). Inductance L becomes:

$$L=(AN^2/l)\beta=(AN^2/l)(\beta_r+m_h H_{TEST})=(AN^2/l)\beta_r+k_h H_{TEST},$$

$$L=L_r+k_h(N/l)\cdot I_{TEST}=L_r+k_i I_{TEST}=L_r+L_d,$$

... in terms of $I_{TEST}$.

The "r" subscripts refer to reference field values at zero magnetic field; the "d" subscript refers to differential field values from zero field; and the m,k parameters define the linearity/slope:

$\beta_r$ effective permeability inside the coil at zero field,
$L_r=(AN^2/l)\beta_r$; inductance of the sensor at zero field,
$L_d=k_i I_{TEST}$; differential inductance of the sensor vs. zero field, from $I_{TEST}$,
$L_d=k_h H_E$; differential inductance of the sensor vs. zero field, from $H_E$,
$m_h$ $\beta$-H curve, or change in permeability for a change in H,
$k_h=m_h(AN^2/l)$; L-H curve, or change in inductance for a change in H, $k_i=k_h(N/l)$; L-I curve, or change in inductance for a change in $I_{TEST}$.

Note that $m_h$, $k_h$, and $k_i$ differ from each other by constants that depend on the A,N,l parameters of the sensor coil. As delta β grows with delta H following the $m_h$, $k_h$ curves, L will follow. The oscillation frequency of the circuit follows L in linear fashion, and so will the output counts.

During calibration when different values of $I_{TEST}$ are applied, the change in inductance $L_d=k_i·I_{TEST}$ will be characterized.

At a later time as $H_E$ changes it will respond in the same way as $H_{TEST}$ did during the characterization, thus allowing correction of any linearity/slope errors measured in $k_i$ during characterization with $I_{TEST}$.

$$\beta_e=m_hHe,$$

$$L=(AN^2/l)\beta=(AN^2/l)(\beta_r+\beta_e)=L_r+k_hH_E=L_r+k_i(l/N)$$
$$H_E=L_r+L_d.$$

A practical calibration may have $k_i$ defined in terms of counts/A, which takes care of any other system parameters to be accounted for. Then a conversion constant to $k_h$ counts/T takes into account β,l,N and other system parameters to be accounted for.

The method of calibration with current $I_{TEST}$ is very similar whether it is performed in a Magnetic Sensor with Self-Calibration 200 with an internal current source, or in a calibration test system 900 with an external current source.

For embodiments, an offset field is determined by sweeping the Test bias current ($I_{TEST}$) in both the positive and negative directions and then calculating the Test current that results in zero counts, and looping, or stepping through this until a predefined threshold is met. The Test current that corresponds to the offset field of the sensor under test is often called the null current because embodiments use this technique to calibrate out (i.e., nullify) the effects of the local external magnetic field ($H_E$) on the magneto-inductive sensor under test.

Embodiments of the test system can be calibrated to determine the relationship between applied Test bias current and magnetic field, i.e., how many uA applied to the magneto-inductive sensor per uT of DC magnetizing field. For embodiments, calibration of the test system is accomplished by measuring a population of sensors in a Helmholtz cage to determine the sensor characteristics as a function of magnetic field, and then measuring these same sensors with the test system and determining the calibration coefficients necessary to give the same results as what was measured on the Helmholtz coil.

For embodiments, to test on a magneto-inductive sensor, the Keithley current source 920 is controlled to sweep a Test bias current through the magneto-inductive sensor, and the digital counts from the magneto-inductive sensor measurement circuit 930 output is collected for each applied $I_{TEST}$ current, which is then automatically related to the applied magnetic field in the form of uA per uT per the calibration. The benefits are that the test system does not need a magnetic field generating cage, resulting in smaller size, reduced cost, and reduced complexity compared to cage-based methods, the test system can cancel the effects of the local external magnetic fields for the DUT, and test system can perform both accurate and fast (<1 second) manufacturing QA/functional testing.

Typically, this level of accuracy requires external Helmholtz coils and comparatively long test times compared with Test system. A unique aspect of Test system is that is can be used to efficiently and simultaneously quantify both the sensor linearity and sensor noise, often defined by the standard deviation of the output when under a constant applied magnetic field. In this context, the test system can utilize a grand mean of the measured standard deviations for each applied $I_{TEST}$ current. That is, several data points are collected at each bias current, and the standard deviation is calculated. The next bias current is applied, several more points are collected, and a new standard deviation calculated. An average or weighted average of these standard deviations can be used to represent the noise performance of the sensor over a range of applied magnetic fields rather than at only 1 magnetic field (or a pair of fields such as ±50 uT). Another unique aspect of the Test system is that the magneto-inductive sensor under test can be placed inside a small magnetically shielded environment, such as a Mu metal box, and therefore, any magnetic noise from the ambient environment can be reduced and/or eliminated by the shield box such that the true sensor noise characteristics can be measured.

Figure 10:
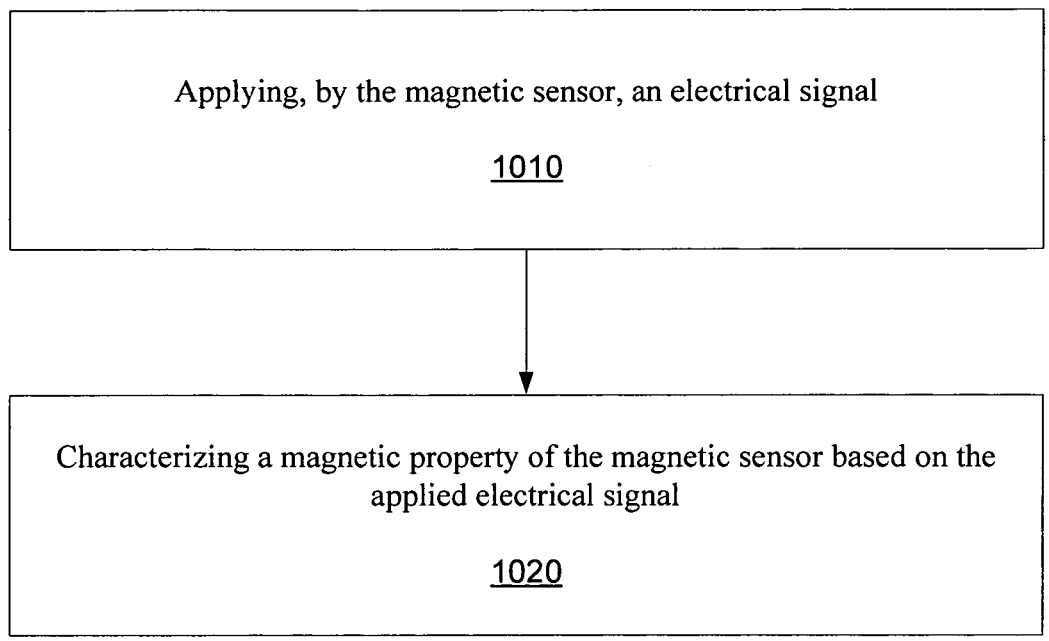
FIG. 10 is a flow chart includes a method of a magnetic sensor self-characterizing magnetic properties, according to an embodiment.

FIG. 10 includes a method of a magnetic sensor self-characterizing magnetic properties according to an embodiment. A first step 1010 includes applying, by the magnetic sensor, an electrical signal. A second step 1020 includes characterizing a magnetic property of the magnetic sensor based on the applied electrical signal.

For at least some embodiments, characterizing a magnetic property of the magnetic sensor further includes monitoring of the magnetic property.

For at least some embodiments, the applied electrical signal comprises an applied current. More specifically, embodiments include applying the applied current to a coil within the magnetic sensor. The magnetic property can include a value of inductance of the coil. Further, embodiments of characterizing the magnetic property include characterizing the coil for a plurality of values of applied current, and/or calculating a scale factor that represents a change in a value of inductance of the coil for different values of applied current. For a value of inductance, a linearity of the scale factor of the coil can be calculated for different values of applied current. Further, a noise of the value of the calculated inductance of the coil for multiple measurements of the value of the inductance can be calculated for a single value of applied current.

For an embodiment, the coil is included within a relaxation oscillator that generates an output signal that includes a frequency that is dependent upon an applied magnetic field, and further includes counting the output signal with a signed up/down counter, wherein an output of the signed up/down counter provides a representation of the intensity and a direction of the applied magnetic field. For a specific embodiment, a current conducted through the coil is adjusted to zero a count of the output of the signed up/down counter. The adjusted current provides a measurement of an ambient magnetic field. An embodiment further includes a control loop that adjusts current through the coil to zero the count of the up/down counter, thereby continually forcing the count to zero.

For at least some embodiments, the applied current comprises an alternating current (AC) current. Aside from the ability to measure time varying magnetic field signals, for an embodiment, a circuit to introduce a time varying AC $I_{TEST}$ current during the intervals between magnetic field signal measurements can be used to keep magnetic domains in the inductive sensor's magnetic core material in an optimum state of relaxation or alignment to further enhance sensitivity and signal to noise ratio.

For an embodiment, the magnetic sensor is one of a plurality of sensors. Further, a linearity and/or noise of a magnetic property of each of the magnetic sensors are characterized. Use of measurements of each one of the plurality of magnetic sensors that has a characterized linearity that is worse than a threshold or a characterized noise that is greater than a threshold are deemphasized. This embodiment can be useful, for example, in systems that utilize multiple sensors, such as a large array of sensors used in a gradiometric mode for magnetic imaging or ferrous object detection. Alternatively, the same concept can be applied in magnetic vector measurements as well, where multiple sensors are configured for measurement redundancy. For these systems, the sensors that are determined to have a noise, linearity and/or gain that is worse than the defined thresholds could be deemphasized in some algorithmic fashion. At least some embodiments include the control and the plurality of sensors co-located on a single integrated circuit, and the control can either self-calibrate or self-select sensors of the integrated circuit for use.

Although specific embodiments have been described and illustrated, the described embodiments are not to be limited to the specific forms or arrangements of parts so described and illustrated. The embodiments are limited only by the appended claims.

What is claimed:

1. A magnetic sensor apparatus, comprising:
   a magnetic sensor;
   current source for applying a current to the magnetic sensor;
   control circuitry configured to control the current source, comprising adjusting the current applied to the magnetic sensor to at least two different values; and characterizing a magnetic property of the magnetic sensor based on the applied current, comprising measuring a gain of the magnetic sensor, wherein the gain represents a change in a value of an inductance of the magnetic sensor over the at least two different values of applied current.

2. The apparatus of claim 1, wherein the magnetic sensor comprises a coil.

3. The apparatus of claim 2, wherein the control circuitry is further operative to calculate a linearity of the gain of the coil for at least three different values of applied current.

4. The apparatus of claim 2, wherein the control circuitry is further operative to calculate a noise of at least one value of differential inductance of the coil for multiple measurements of the value of the differential inductance for a single value of applied current.

5. The apparatus of claim 2, wherein the coil is included within a relaxation oscillator that generates an output signal that includes a frequency that is dependent upon an applied magnetic field, and further comprising counting the output signal with a signed up/down counter, wherein an output of the signed up/down counter provides a representation of the intensity and a direction of the applied magnetic field.

6. The apparatus of claim 5, further comprising a control loop that adjusts current through the coil to the zero the count of the up/down counter, thereby continually forcing the count to zero.

7. A method of a magnetic sensor self-characterizing magnetic properties, comprising:
   applying, by the magnetic sensor, an electrical signal;
   characterizing a magnetic property of the magnetic sensor based on the applied electrical signal, comprising adjusting the electrical signal applied to the magnetic sensor to at least two values, and measuring a gain of the magnetic sensor, wherein the gain represents a change in a value of an inductance of the magnetic sensor over the range of at least two values of applied electrical signal.

8. The method of claim 7, wherein the applied electrical signal comprises an applied current.

9. The method of claim 8, further comprising applying the applied current to a coil within the magnetic sensor.

10. The method of claim 9, wherein the magnetic property comprises a value of differential inductance of the coil.

11. The method of claim 10, wherein the coil is included within a relaxation oscillator that generates an output signal that includes a frequency that is dependent upon an applied magnetic field, and further comprising counting the output signal with a signed up/down counter, wherein an output of the signed up/down counter provides a representation of the intensity and a direction of the applied magnetic field.

12. The method of claim 11, further comprising adjusting a current conducted through the coil to zero a count of the output of the signed up/down counter, wherein the adjusted current provides a measurement of an ambient magnetic field.

13. The method of claim 12, further comprising a control loop that adjusts current through the coil to the zero count of the up/down counter, thereby continually forcing the count to zero.

14. The method of claim 7, wherein the gain represents a change in a value of the inductance of the coil for different values of applied current.

15. The method of claim 7, wherein the gain represents a change in a value of the magnetic property of the coil for different values of applied current.

16. The method of claim 15, wherein characterizing the magnetic property further comprises calculating a linearity of the gain of the coil for different values of applied current.

17. The method of claim 15, wherein characterizing the magnetic property further comprises calculating a noise of at least one value of magnetic property of the coil for multiple measurements of the value of the magnetic property for a single value of applied current.

18. The method of claim 7, wherein the applied current comprises an alternating current (AC) current.

19. The method of claim 7, wherein the magnetic sensor is one of a plurality of sensors, and further comprising characterizing at least one of a linearity or noise of a magnetic property of each of the magnetic sensors, and deemphasizing use of measurements of each one of the plurality of magnetic sensors that has a characterized linearity that is worse than a threshold or a characterized noise that is greater than a threshold.

20. A method of characterizing a magnetic sensor, comprising:
    applying an electrical signal to the magnetic sensor;
    characterizing a magnetic property of the magnetic sensor based on the applied electrical signal, comprising adjusting the electrical signal applied to the magnetic sensor to at least two different values, and measuring a gain of the magnetic sensor, wherein the gain represents a change in a value of an inductance of magnetic sensor over the at least two different values of applied electrical signal.

21. A method of characterizing magnetic properties of a coil, comprising:
    applying an electrical signal to the coil;
    characterizing a magnetic property of the coil based on the applied electrical signal, comprising adjusting the electrical signal applied to the coil to at least two different values, and measuring a gain of the coil, wherein the gain represents a change in a value of an inductance of the coil over the at least two different values of applied electrical signal.

22. The method of claim 21, wherein characterizing a magnetic property of the magnetic sensor further comprises monitoring of the magnetic property.

23. A magnetic sensor, comprising:
a magnetic field sensing element;
a controller operative to characterize a magnetic property of the magnetic field sensing element, comprising applying, by the magnetic sensor, an electrical signal across the magnetic field sensing element, and adjusting the electrical signal applied to the magnetic field sensing element to at least two different values, and measuring a gain of the magnetic field sensing element, wherein the gain represents a change in a value of an inductance of the magnetic field sensing element over the at least two different values of applied electrical signal.

24. The method of claim 23, wherein the controller characterizing the magnetic property of the magnetic field sensing element further comprises the controller being operative to monitor the magnetic property.

25. A testing system for a magnetic sensor, comprising:
a controlled electrical signal source;
a controller operative to characterize a magnetic property of the magnetic sensor, comprising controlling an application, by the controlled electrical signal source, an electrical signal across the magnetic sensor, and adjusting the electrical signal applied to the magnetic sensor to at least two different values, and measuring a gain of the magnetic sensor, wherein the gain represents a change in a value of an inductance of the magnetic sensor over the at least two different values of applied electrical signal.

* * * * *